(12) United States Patent
Falk

(10) Patent No.: US 8,313,341 B1
(45) Date of Patent: Nov. 20, 2012

(54) GUIDE ELEMENT FOR A CONNECTOR DEVICE

(75) Inventor: Björn Falk, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 13/141,477

(22) PCT Filed: May 30, 2011

(86) PCT No.: PCT/SE2011/050673
§ 371 (c)(1),
(2), (4) Date: Jun. 22, 2011

(51) Int. Cl.
*H01R 11/18* (2006.01)

(52) U.S. Cl. .......... 439/482; 439/951; 324/538

(58) Field of Classification Search .......... 439/482, 439/951, 374, 377, 496; 324/538
See application file for complete search history.

(56) References Cited

U.S. PATENT DOCUMENTS

| | | | | |
|---|---|---|---|---|
| 3,278,887 A | * | 10/1966 | Travis | 439/496 |
| 3,696,319 A | * | 10/1972 | Olsson | 439/496 |
| 6,027,347 A | | 2/2000 | Reichle | |
| 6,089,894 A | | 7/2000 | Fletcher | |
| 6,496,014 B1 | * | 12/2002 | Cook | 324/539 |
| 6,695,633 B2 | * | 2/2004 | Longueville et al. | 439/260 |
| 6,899,546 B2 | * | 5/2005 | Longueville et al. | 439/64 |
| 2006/0141826 A1 | * | 6/2006 | Olson et al. | 439/79 |
| 2007/0197088 A1 | * | 8/2007 | Lindkamp et al. | 439/571 |

FOREIGN PATENT DOCUMENTS

| | | |
|---|---|---|
| DE | 20011222 U1 | 12/2000 |
| WO | 0159886 A1 | 8/2001 |

* cited by examiner

*Primary Examiner* — Neil Abrams
*Assistant Examiner* — Phuongchi Nguyen
(74) *Attorney, Agent, or Firm* — Coats & Bennett, P.L.L.C.

(57) ABSTRACT

Guide element (3) for a connector device (1), which element has a first and a second end (3*a*, 3*b*). The element (3) is adapted to be attached to a PCB (printed circuit board) (2) of the connector device. Further, the guide element comprises a first bevel (33) at the first end (3*a*), the surface of which is provided with a plurality of recesses (36), which recesses are adapted to receive a plurality of conductive connector tongues (4) of the connector device (1). Further, a connector device (1) for establishing a connection between a test device and a test system, a connector arrangement (11) for test procedures comprising at least one connector device (1) and a method of manufacturing a connector device (1) is comprised as well.

17 Claims, 5 Drawing Sheets

GUIDE ELEMENT FOR A CONNECTOR DEVICE

TECHNICAL FIELD

The present invention relates to a guide element for a connector device, a connector device comprising a guide element for establishing a connection between a test device and a test system, a connector arrangement for test procedures comprising at least one connector device and a method of manufacturing a connector device.

BACKGROUND

When manufacturing electronic equipment, test procedures are normally performed in order to ensure that the equipment functions correctly. An electronic equipment, such as a device to be used in a computer or telecom network, comprises a least one printed circuit board (PCB) carrying the components and circuitry necessary for the device to perform its desired function, an enclosure in which the PCB(s) is/are positioned and at least one external connector enabling connection to be made with the circuitry within the device.

The test procedures typically include making electrical contact with the external connector (s) to enable the application of electrical signals to the circuitry within the device and to record the response. The present invention is directed to establishing the electrical connection during the test procedure. Therefore, the actual test procedures that are conducted do not form part of the invention.

One type of electrical connectors that are well known to be used for signal inputs and outputs to e.g. devices used in a computer or telecom network is a RJ11 connector or a RJ745 connector. These connectors are push-fit connectors that provide e.g. eight terminal connections and are used for connecting cables that carry signals. All of the connections may be used either as loop-back or direct connections.

A standard connector such as RJ11 or RJ45 or similar has a mechanical interlock between the male part of the connector and the female part, which interlock is normally formed of a resilient member that forms a latch on insertion of the male part into the female part, and which must be deflected by the user in order to break the connection. This connector is thus a mechanically secure connection and is widely used.

In a test environment it is desirable to rapidly establish and break electrical connections to devices in order to enable to test and process as many devices as possible during a certain amount of time. The use of a "normal" RJ11 or RJ45 male connector in order to make contact to the female connector on the device during test conditions has disadvantages since the mechanical interlock has to be operated manually. Therefore, the handling of such a connector is difficult to automate, and it would increase time of the test cycle if it is necessary to establish and break electrical connections with the help of the mechanical interlock for each socket under test. Furthermore, such standard connectors may not be constructed sufficiently durable for a test environment.

In the test environment, the device to be tested is held in a specific position such that the connector devices may be inserted automatically e.g. by machinery or by a robot in order to establish connection between a test system and a test device.

A commonly used connector device comprises a male connector and a female socket, wherein in each one RJ11 or RJ45 or another standard connector is fitted. The standard connector is used for testing electronic connections of telecommunication equipment, switches, routers, gateways etc. The male connector is push-fitted and has the same number of terminal connections as the standard connector, but comprises no mechanical interlock.

This type of connector devices are sometimes referred to as "wear boards", wherein the cables from the test equipment is connected via the connector device, which is interchangeable, to the device that shall be tested.

The male connector's terminal connections may be in the form of conductive pathways, tracks or signal traces etched from copper sheets laminated onto a non-conductive substrate, e.g. metal directly attached on the PCB, and may be gold plated. A problem with this solution is that the conductive tracks erode from the laminate when repeatedly inserted into female sockets during testing. This result in bad connections, and often splinting where parts of the conductive material may come off and may cause a short circuit.

U.S. Pat. No. 6,089,894 describes an automatic insertion connector device, for instance for use in a test environment, particularly for connection to an RJ45 type connector. The connector has a contact portion having the general form of a connector part arranged to match the connector part it is intended to connect to.

This known connector device and the wear boards with male connectors consisting of conductive tracks on the PCB both have a disadvantage of small connecting area between the horizontal conductive area of the male connector, and the angled conductive tongues within the female sockets. Thus, there is a need for an improved connector device with an improved guide element that brings the connector device in connection with the connector part.

SUMMARY

The object of exemplary embodiments described hereinafter is to address the problem outlined above, and this object and others are achieved by the apparatus and the method according to the appended independent claims, and by the embodiments according to the dependent claims.

According to a first exemplary aspect, embodiments provide a guide element for a connector device, which element has a first and a second end, and which element is adapted to be attached to a PCB (printed circuit board) of the connector device. The guide element comprises a first bevel at the first end, the surface of which is provided with a plurality of recesses, which recesses are adapted to receive a plurality of conductive connector tongues of the connector device.

Thus, an advantage with the guide element is that it is sufficiently durable for a test environment. Since the plurality of recesses of the first bevel are adapted to receive a plurality of conductive connector tongues short circuiting between different circuits is reduced.

The guide element may be substantially shaped as a box, the sides of which are perpendicular with respect to each other. The guide element may have at least three bevels at the first end of the guide element, each bevel arranged on one respective side of the guide element. Due to the bevels a large connection area of the connector tongues with the mating contact springs in the corresponding socket is given, leading to a better electrical connection. The bevels will also make the insertion of the guide element together with the connector tongues into the corresponding female socket easier.

The guide element may have two rims, which are arranged at opposite sides of the guide element, thereby defining between the rims a recess adapted to receive the PCB. This design is advantageously since it allows easy assembling of the guide element and the PCB, ensuring that the guide element is correctly assembled with the PCB. Furthermore this design where the guide element covers the edge of the PCB reduces friction during insertion into the female socket.

The guide element may be made of a non-conductive material, and the guide element may comprise a through hole adapted to receive a fixing means for attaching the guide element to the connector device in an opening. Alternatively, the guide element may comprise a protruding element, wherein the guide element is adapted to be snapped on to the PCB by means of inserting the protruding element through the opening. The protruding element makes the mounting and assembling of the guide element to the PCB easy.

According to a second exemplary aspect, embodiments provide a connector device for establishing a connection between a test device and a test system. The connector device comprises an elongated PCI with a thickness, and with a first and a second end, and with a first side and a second side, the second side opposite the first side, where the PCB at the first end has a width. Further, the connector device comprises a plurality of conductive connector tongues attached to the first end at the second side of the PCB and protruding from the PCB. The connector device also comprises a guide element arranged on the first side of the PCB at the first end, wherein the first end of the guide element protrudes from the first end of the PCB.

This connector device has the advantage that it is able to stand many cycles in the test environment. Thus, leading to decreased costs since this type of connector device is not necessary to be changed after a relatively short time of testing and since less time is needed for stopping the test procedures in order to change the connector devices. The design with conductive connector tongues is also advantageously since it leads to reduced splinting which is a problem when using conductive tracks on the PCB as terminal connections. Furthermore this design allows for larger contact area between the male and female connectors.

The guide element of the connector device may protrude from the PCB at the first end thereof so as to receive the conductive connector tongues in the recesses in the first bevel. Further, regarding the connector device the recess between the rims of the guide element may have a width that substantially corresponds to the width of the PCB sides. And the height of the rims corresponds substantially to the thickness of the PCB, in order to arrange the PCB in the recess. There may be a holding block attached to the second end of the PCB.

According to a third exemplary aspect, embodiments provide a connector arrangement for test procedures, the connector arrangement comprising at least one connector device, wherein the connector arrangement may comprise a connecting socket attached to the PCB and the connector device may be arranged for connection between at least one test device and at least one test system. The connector arrangement may comprise at least two connector devices arranged in parallel in one direction or arranged in two perpendicular directions. Further, on the connector devices the holding block and the at least one connecting socket may be arranged on the first side of the PCB, and the connector devices may be arranged on top of each other, such that the second sides of two adjacent PCBs are facing each other. Further, in an alternative embodiment may the holding block and the at least one connecting socket be arranged on the first or the second side of the PCB, and two connector devices are arranged on top of each other, such that the second side of the first connector device faces the first side of the second connector device.

In the connector arrangement there may be a spring element arranged on the side of the holding block of the connector device facing the second end in order to allow movement of the connector device. Further, in the connector arrangement there may be fixing means arranged in a second and third opening of the PCB and partly filling said openings.

According to a fourth exemplary aspect, embodiments provide a method of manufacturing a connector device comprising a guide element with a first bevel at a first end, the surface of which is provided with a plurality of recesses. The method comprises attaching a first end and first side of an elongated PCB in a recess of a guide element, which recess is defined between two rims. The method comprises providing a comb-shaped connecting plate with a plurality of conductive connector tongues protruding from a common body. Further, the method comprises guiding the conductive connector tongues of the comb-shaped connecting plate by the plurality of recesses in the bevel of the guide element. The method comprises attaching the conductive connector tongues of the comb-shaped connecting plate to the first end and second side of the PCB, and letting the conductive connector tongues protrude from the PCB. Further, the method comprises bending the conductive connector tongues in order for the tongues to be arranged in the recesses of the first bevel, and breaking off the common body of the comb-shaped connecting plate.

Thus, the connector device is manufactured in an efficient way, which may limit the costs of production.

BRIEF DESCRIPTION OF THE DRAWINGS

The exemplary embodiments will now be described in more detail, and with reference to the accompanying drawings, in which.

DETAILED DESCRIPTION

In the following description, the invention will be described in more detail with reference to certain embodiments and to the accompanying drawings. For purposes of explanation and not limitation, specific details are set forth, such as particular scenarios, techniques, etc., in order to provide a thorough understanding of it. However, it is apparent to one skilled in the art that it may be practised in other embodiments that depart from these specific details.

A concept of exemplary embodiments is to provide a test environment, in which durable connectors are easily inserted in order to make test procedures run as smoothly as possible. This test environment for test procedures comprises a connector arrangement, which comprises a connector device for establishing a connection between a device to be tested and a test system and which connector device comprises a guide element.

Figure 1:
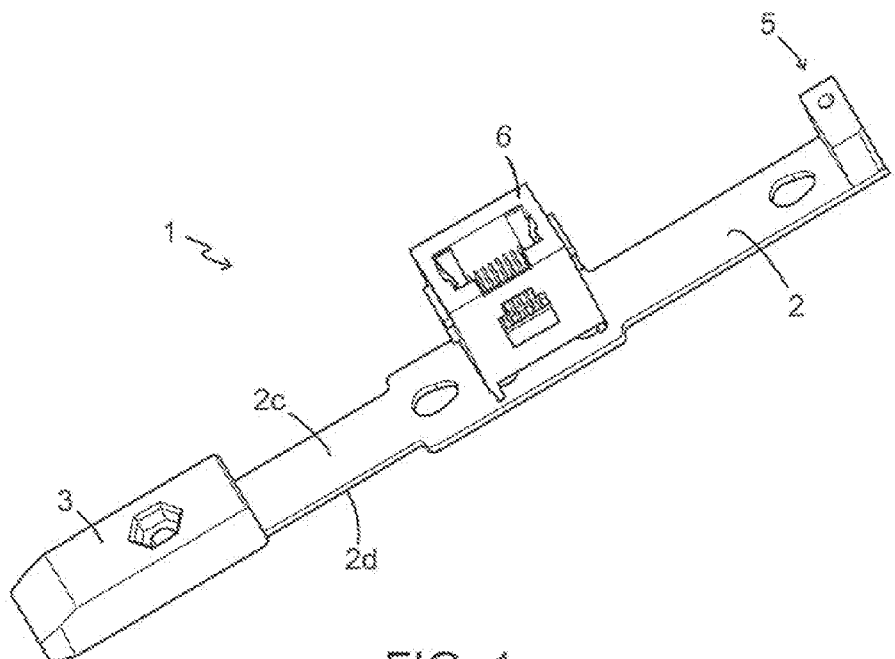
FIG. 1 illustrates a perspective view of an exemplary connector device.
Figure 2:
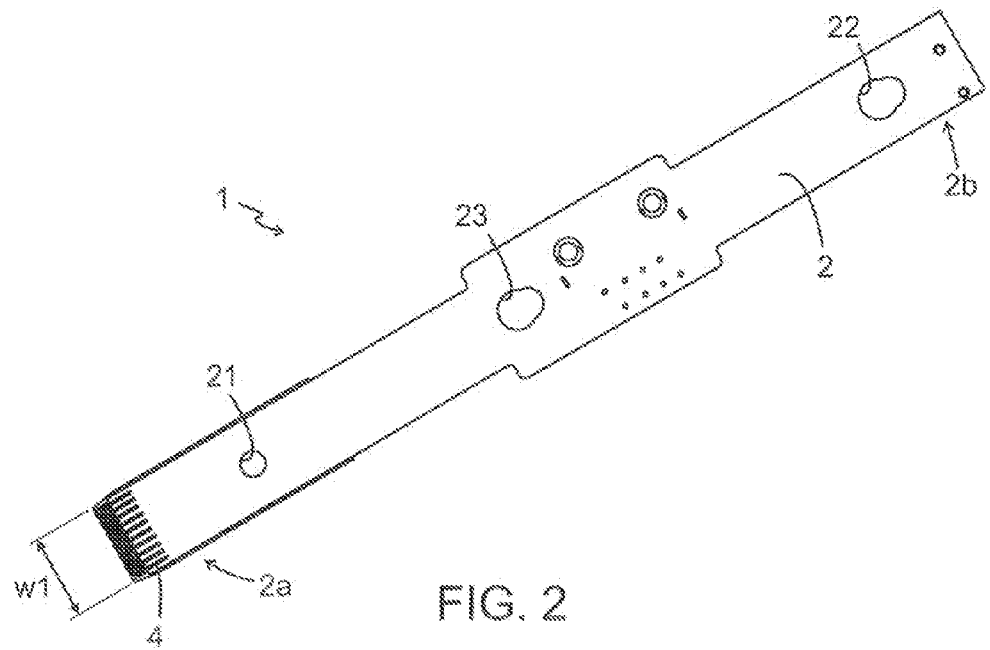
FIG. 2 illustrates a view of the exemplary connector device seen from the second side.

FIG. 1 illustrates an exemplary embodiment of a connector device 1 seen in a perspective view. Mounted to a first side 2c of an elongated PCB 2 are a guide element 3, a holding block 5 and a connecting socket 6. The PCB has also a second side 2d that is opposite of the first side, from which side the connector device is shown in FIG. 2. The holding block 5 may also be arranged on the second side 2d. In an alternative embodiment, the holding block is omitted and the connector device is arranged in an alternative way to allow movement in the connector arrangement 11 (see FIG. 8), e.g. by applying a spring load to the second end 2b of the PCB. FIG. 1 shows one connecting socket 6, but there may also be more than one socket arranged on the PCB, or no connecting socket on each PCB (see below in relation to FIG. 8). The connecting socket may either be a female or a male socket.

Figure 8:
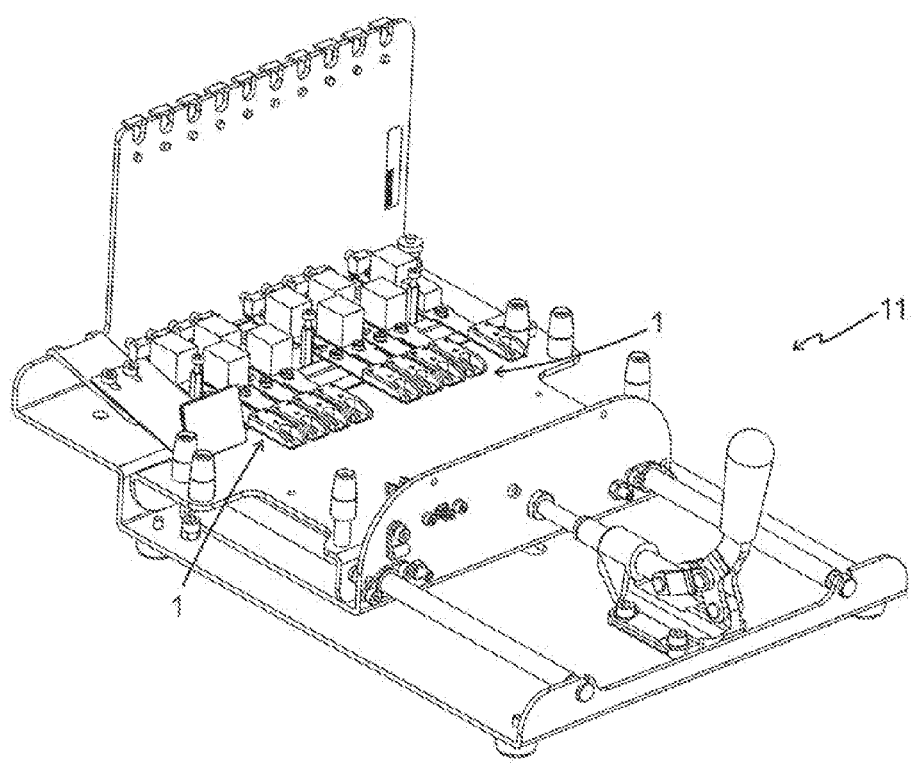
FIG. 8 illustrates a perspective view of an exemplary connector arrangement with a plurality of exemplary connector devices.

In FIG. 2, the connector device 1 is shown from the second side 2d. As illustrated in the figure, the PCB 2 has a first end 2a and a second end 2b, where the PCB at the first end 2a has a width w1. The width of the second end 2b is substantially the same as the width of the first end. The PCB may have a larger width at a part of the mid-region between the first and second ends 2a, 2b. In this part of the mid-region, the connecting socket 6 is normally arranged on the first side 2c, as illustrated in FIG. 1, but it could also be arranged on the second side 2d. It is desirable to arrange the connector devices close to each other, which is shown in FIG. 8. (This figure is further described below.) Therefore, the part of the mid-region with a greater width, i.e. a so called bulge is not the same for two adjacent connector devices. Preferably, there are two embodiments for arranging bulge at the mid-region of the PCB; one embodiment with the bulge close to the centre of the PCB seen in a longitudinal direction, and the other with the bulge closer to the second end 2b of the PCB, such as may be seen in FIG. 8.

Further, the connector device comprises a plurality of conductive connector tongues 4 attached to the first end 2a at the second side 2d of the PCB and protruding from the PCB. The connector tongues may be made of metal. The holding block 5 is attached to the second end 2b of the PCB. The connector device comprises also the guide element 3 arranged on the first side 2c of the PCB at the first end 2a, wherein the first end 3a of the guide element 3 protrudes from the first end 2a of the PCB 2.

The guide element 3 protrudes from the PCB at the first end 2a thereof. The protruding part of the guide element comprises a first bevel 33 with recesses 36 so as to receive the conductive connector tongues 4 in the recesses 36 of the first bevel 33.

Figure 3:
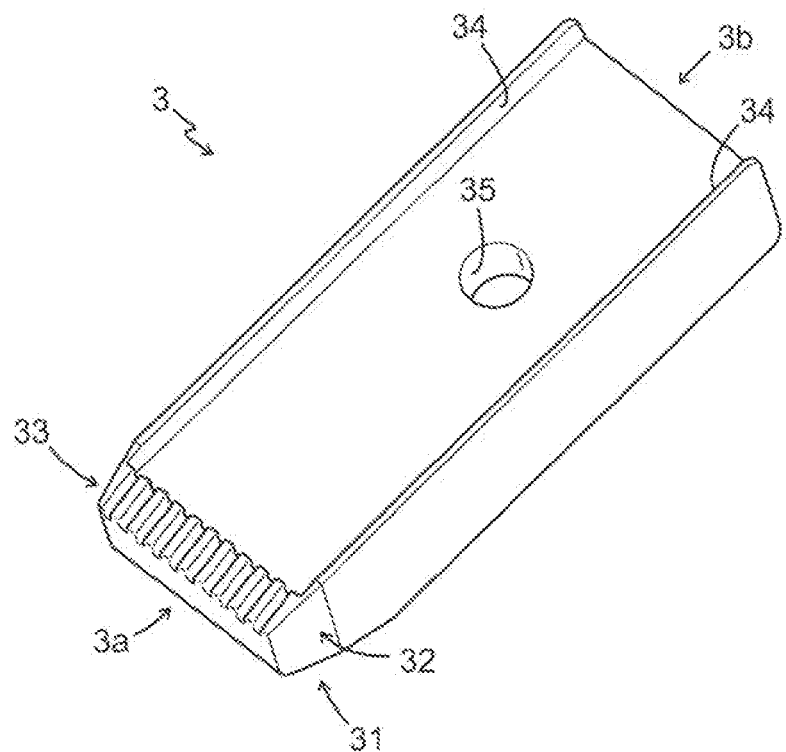
FIG. 3 illustrates a perspective view of a first exemplary embodiment of the guide element.
Figure 4:
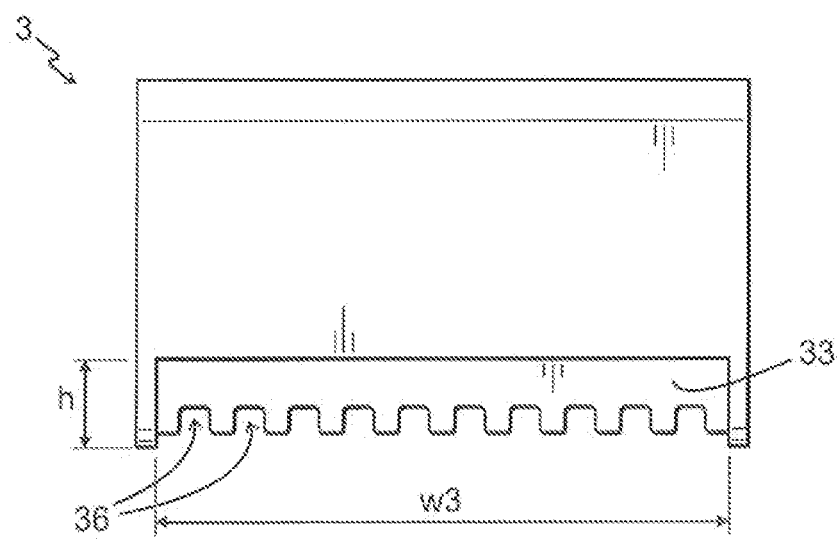
FIG. 4 illustrates a view of the guide element seen from the second end.
Figure 5:
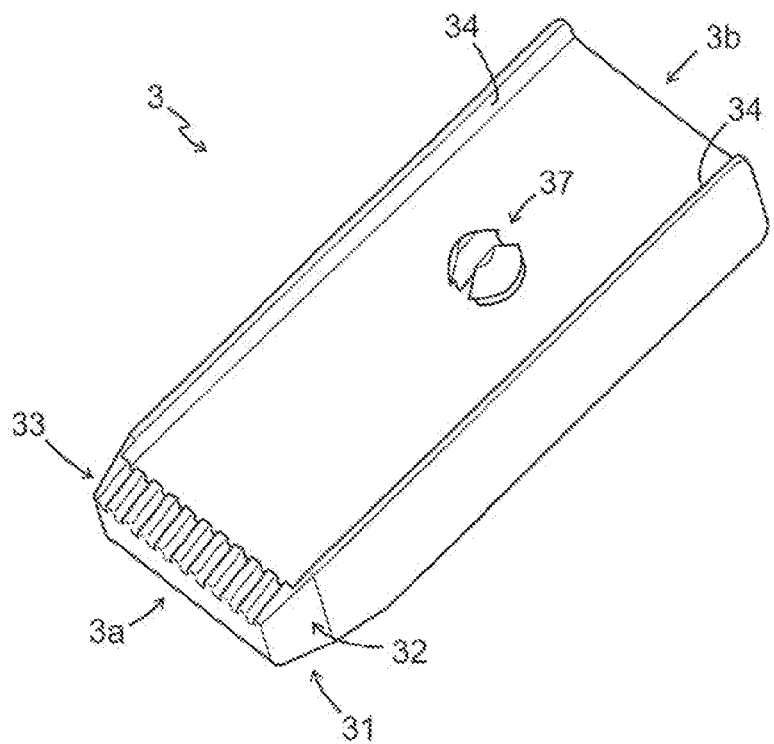
FIG. 5 illustrates a perspective view of a second exemplary embodiment of the guide element.

FIG. 3 illustrates an exemplary embodiment of a guide element 3 for a connector device 1. The guide element has a first and a second end 3a, 3b, and the element 3 is adapted to be attached to a first side 2c of the PCB 2 of the connector device. The first bevel 33 of the guide element is comprised at the first end 3a. The recesses 36 of the first bevel 33 are seen in FIGS. 3, 4 and 5. The first bevel has preferably an angle of between 20° to 30° in relation to the horizontal surface of the guide element that is adapted to be mounted to the PCB 2, i.e. arranged between two rims 34 (see below). The amount of the angle is adapted to fit the angle of the contact springs of the corresponding contact.

According to an exemplary embodiment, the guide element is substantially shaped as a box, the sides of which are perpendicular with respect to each other. The guide element has at least three bevels 31, 32, 33 at the first end 3a of the guide element 3, each bevel arranged on one respective side of the guide element.

According to a further exemplary embodiment, the guide element has two rims 34, which are arranged opposite each other at longitudinal sides of the guide element 3, thereby defining between the rims 34 a recess adapted to receive the PCB 2. The guide element 3 is made of an electrically non-conductive material, e.g. plastic, in order to make sure that the material of the guide element electrically insulates the connector tongues 4 arranged in the recesses 36, and that the surface of the guide element does not build up any electric charge. Therefore, the material of the guide element 3 should preferably also be anti-static.

In the exemplary embodiment seen in FIG. 3 the guide element 3 comprises a through hole 35 adapted to receive a fixing means for attaching the guide element 3 to the connector device 1 in a first opening 21 of the PCB 2. Alternatively, in another exemplary embodiment as may be seen in FIG. 5, the guide element 3 comprises a protruding element 37. By means of inserting the protruding element 37 through the first opening 21 the guide element is adapted to be snapped on to the PCB 2. The protruding element is an integrated part of the guide element, consisting of two semi-circular parts. The two parts may deflect towards each other when the protruding element is being inserted through the first opening 21.

Figure 6:
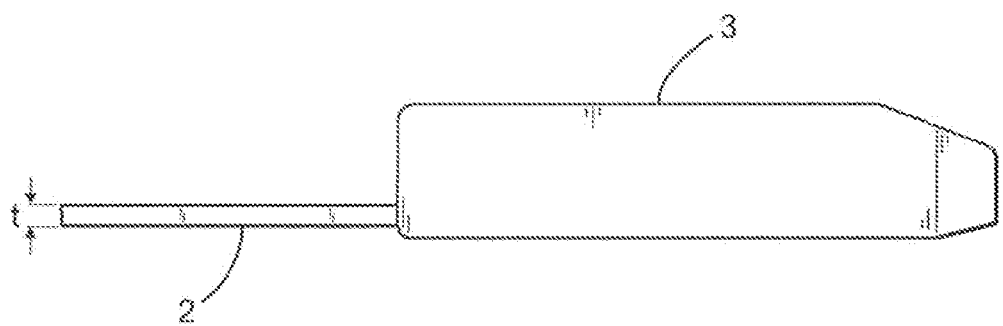
FIG. 6 illustrates an exemplary guide element together with a part of the PCB.

As may be seen in FIG. 4, the guide element 3 has a recess with a width w3. This recess is defined between the rims 34 of the guide element, which is seen in FIGS. 3 and 5. And width w3 of the recess may substantially correspond to the width w1 of the PCB. Further, the height h of the rims 34 substantially corresponds to the thickness t of the PCB, in order to arrange the PCB in the recess. The thickness t of the PCB is shown in FIG. 6. In this side view is the first side 2c of the PCB directed upwards and the second side 2d downwards.

In FIG. 8 is the exemplary embodiment of the connector arrangement 11 for test procedures comprising at least one connector device 1 shown. The connector device is arranged for connection between at least one test device and at least one test system. The connector arrangement 11 comprises at least one connecting socket 6 attached to the PCB of at least one of the connector devices 1.

In FIG. 8 nine connector devices 1 are arranged in the connector arrangement 11. As may be seen in FIG. 8 the connector devices are arranged in parallel in one direction. They may also be arranged in parallel in two perpendicular directions, i.e. side by side along their longitudinal sides (as in FIG. 8) and one on top of the other along their longitudinal sides. When arranged in parallel in two perpendicular directions the connector arrangement comprises at least two connector devices.

Regarding the connector arrangement, when the connector devices are arranged on top of each other the second sides 2d of two adjacent PCBs faces each other, in order to easy have access to plug in a connector into the connecting socket 6 arranged on the first side 2c of each connector device. In an alternative embodiment two connector devices are arranged on top of each other with a first side 2c of a first connector device facing the second side 2d of an adjacent connector device, and with the connecting socket 6 and the holding block 5 of the first connector device arranged on the second side 2d and the connecting socket 6 and the holding block 5 of the adjacent connector device arranged on the first side 2c.

In the connector arrangement there may be a spring element arranged on the side of the holding block 5 of the connector device facing the second end 2b in order to allow movement of the connector device in the longitudinal direction. Fixing means are arranged in a second and third opening 22, 23 of the PCB 2 and partly filling said openings. The second and third opening 22, 23, which may be seen in FIGS.

1 and 2, of the PCB are adapted to have a larger diameter than the diameter of the fixing means adapted to be fitted therein. The opening may be oval shaped, consisting of two circles with different diameters or be key-hole shaped.

Figure 9:
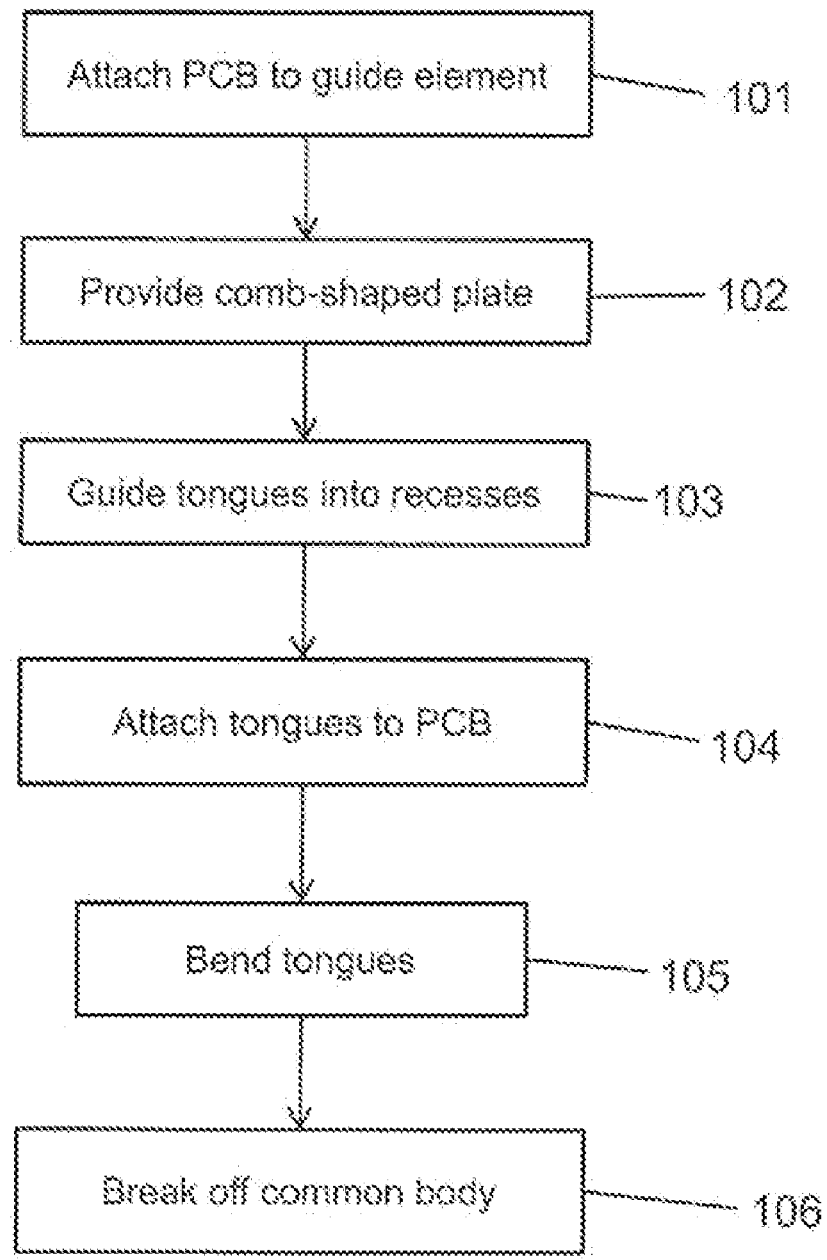
FIG. 9 is a flowchart of an exemplary method of manufacturing a guide element.

FIG. 9 is a flowchart illustrating an exemplary method of manufacturing a connector device. The illustrated method of manufacturing the connector device 1 comprises the following steps attaching 101a first end 2a and first side 2c of an elongated PCB 2 in a recess of a guide element 3, which recess is defined between two rims 34, providing 102 a comb-shaped connecting plate 40 with a plurality of conductive connector tongues 4 protruding from a common body 41, guiding 103 the conductive connector tongues 4 of the comb-shaped connecting plate 40 by the plurality of recesses 36 in the bevel 33 of the guide element 3, attaching 104 the conductive connector tongues 4 of the comb-shaped connecting plate to the first end 2a and second side 2d of the PCB 2, and letting the conductive connector tongues 4 protrude from the PCB, bending 105 the conductive connector tongues 4 in order for the tongues to be arranged in the recesses of the first bevel 33, and breaking off 106 the common body 41 of the comb-shaped connecting plate 40.

Figure 7:
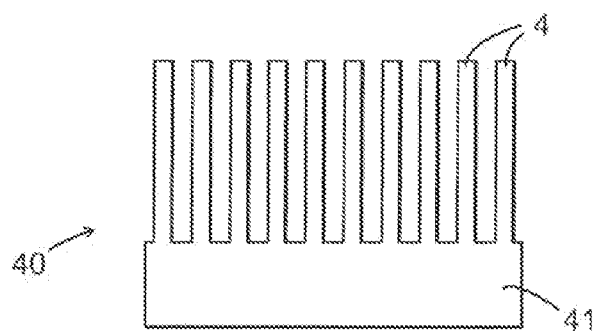
FIG. 7 illustrates an exemplary comb-shaped connecting plate with a plurality of conductive connector tongues.

FIG. 7 illustrates the comb-shaped connecting plate 40 comprising the common body 41 and the conductive connector tongues 4 protruding there from.

Further, the above mentioned and described embodiments are only given as examples and should not be limiting to the present invention. Other solutions, uses, objectives, and functions within the scope of the invention as claimed in the accompanying patent claims should be apparent for the person skilled in the art.

The invention claimed is:

1. A guide element adapted to be connected to a printed circuit board of a connector device, said guide element comprising:
a first end and a second end; and
a first bevel at the first end, the surface of said first bevel including a plurality of recesses,
wherein said recesses are adapted to receive a plurality of conductive connector tongues of the connector device.

2. The guide element according to claim 1, wherein the guide element is substantially shaped as a box, the sides of said box being perpendicular with respect to each other, and wherein said guide element further comprises at least three bevels at the first end, including said first bevel, each bevel arranged on one respective side of the guide element.

3. The guide element according to claim 1, further comprising two rims, each arranged at opposite sides of the guide element, thereby defining between the rims a recess adapted to receive the printed circuit board.

4. The guide element according to claim 1, wherein the guide element comprises a non-conductive material.

5. The guide element according to claim 1, further comprising a through hole adapted to receive a fixing means for attaching the guide element to the connector device via a first opening of the printed circuit board.

6. The guide element according to claim 1, further comprising a protruding element adapted to snap into a first opening of the printed circuit board.

7. A connector device for establishing a connection between a test device and a test system, the connector device comprising:

an elongated printed circuit board having a thickness, a first end and a second end, and a first side and a second side, the second side opposite the first side, wherein the printed circuit board at the first end has a width;

a plurality of conductive connector tongues attached to the first end at the second side of the printed circuit board and protruding from the printed circuit board; and a guide element arranged on the first side of the printed circuit board at the first end, said guide element comprising a first bevel at a first end of the guide element, the surface of said first bevel including a plurality of recesses adapted to receive the plurality of conductive connector tongues, wherein the first end of the guide element protrudes from the first end of the printed circuit board.

8. The connector device according to claim 7, wherein the guide element protrudes from the printed circuit board at the first end thereof so as to receive the conductive connector tongues in the recesses in the first bevel.

9. The connector device according to claim 7, wherein a recess between rims disposed on opposite sides of the guide element has a width that substantially corresponds to the width of the printed circuit board at the first end, and wherein the height of the rims substantially corresponds to the thickness of the printed circuit board, in order to arrange the printed circuit board in the recess.

10. The connector device according to claim 7, wherein the printed circuit board includes a holding block attached to the second end of the printed circuit board.

11. A connector arrangement for test procedures, the connector arrangement comprising:
at least one connector device comprising:
an elongated printed circuit board having a thickness, a first end and a second end, and a first side and a second side, the second side opposite the first side, wherein the printed circuit board at the first end has a width;
a plurality of conductive connector tongues attached to the first end at the second side of the printed circuit board and protruding from the printed circuit board; and
a guide element arranged on the first side of the printed circuit board at the first end, said guide element comprising a first bevel at a first end of the guide element, the surface of said first bevel including a plurality of recesses adapted to receive the plurality of conductive connector tongues, wherein the first end of the guide element protrudes from the first end of the printed circuit board; and
a connecting socket attached to the printed circuit board and the connector device, said connecting socket arranged for connection between at least one test device and at least one test system.

12. The connector arrangement according to claim 11, further comprising a spring element arranged on the side of a holding block of the connector device facing the second end in order to allow movement of the connector device.

13. The connector arrangement according to claim 12, further comprising fixing means arranged in a second and third opening of the printed circuit board and partly filling said second and third openings.

14. The connector arrangement according to claim 11, wherein the connector arrangement comprises at least two connector devices arranged in parallel in one direction or arranged in two perpendicular directions.

15. The connector arrangement according to claim 14, wherein the printed circuit board includes a holding block attached to the second end of the printed circuit board, and wherein the holding block and the connecting socket are arranged on the first side of the printed circuit board, and wherein the connector devices are arranged on top of each other, such that the second sides of two adjacent printed circuit boards face each other.

16. The connector arrangement according to claim 14, wherein the printed circuit board includes a holding block attached to the second end of the printed circuit board, and wherein the holding block and the connecting socket are arranged on the first side or on the second side of the printed circuit board, and wherein two connector devices are arranged on top of each other such that a second side of a first connector device faces a first side of a second connector device.

17. A method of manufacturing a connector device comprising a guide element with a first bevel at a first end, the surface of said first bevel including a plurality of recesses, the method comprising:
  attaching a first end and first side of an elongated printed circuit board in a recess of the guide element, said recess being defined between two rims disposed on opposite sides of the guide element;
  providing a comb-shaped connecting plate with a plurality of conductive connector tongues protruding from a common body;
  guiding the conductive connector tongues of the comb-shaped connecting plate by the plurality of recesses in the first bevel of the guide element;
  attaching the conductive connector tongues of the comb-shaped connecting plate to the first end and second side of the printed circuit board, and letting the conductive connector tongues protrude from the printed circuit board;
  bending the conductive connector tongues in order for the tongues to be arranged in the recesses of the first bevel; and
  breaking off the common body of the comb-shaped connecting plate.

* * * * *

UNITED STATES PATENT AND TRADEMARK OFFICE
CERTIFICATE OF CORRECTION

| | |
|---|---|
| PATENT NO. | : 8,313,341 B1 |
| APPLICATION NO. | : 13/141477 |
| DATED | : November 20, 2012 |
| INVENTOR(S) | : Falk |

It is certified that error appears in the above-identified patent and that said Letters Patent is hereby corrected as shown below:

In the Specifications:

In Column 1, Line 19, delete "a" and insert -- at --, therefor.

In Column 1, Line 33, delete "RJ745" and insert -- RJ45 --, therefor.

In Column 3, Line 15, delete "PCI" and insert -- PCB --, therefor.

Signed and Sealed this
Thirteenth Day of August, 2013

Teresa Stanek Rea
*Acting Director of the United States Patent and Trademark Office*